US00RE34245E

United States Patent [19]

Matsutani et al.

[11] E Patent Number: Re. 34,245

[45] Reissued Date of Patent: May 11, 1993

[54] TWO STAGE CODING METHOD

[75] Inventors: Kiyoshi Matsutani; Ken Ohnishi, both of Kyoto, Japan

[73] Assignee: Mitsubishi Denki Kabushiki Kaisha, Tokyo, Japan

[21] Appl. No.: 578,178

[22] Filed: Sep. 6, 1990

Related U.S. Patent Documents

Reissue of:

[64] Patent No.: 4,769,819
Issued: Sep. 6, 1988
Appl. No.: 905,313
Filed: Dec. 19, 1985

[30] Foreign Application Priority Data

Dec. 26, 1984 [JP] Japan ..... 59-280163

[51] Int. Cl.[5] ..... G06F 11/10

[52] U.S. Cl. ..... 371/38.1; 371/40.1

[58] Field of Search ..... 371/37.2, 38.1, 39.1, 371/40.1

[56] References Cited

U.S. PATENT DOCUMENTS

| | | | |
|---|---|---|---|
| 4,336,612 | 6/1982 | Inoue et al. | 371/37.4 |
| 4,398,292 | 8/1983 | Doi et al. | 371/37.4 |
| 4,413,340 | 11/1983 | Odaka et al. | 371/38.1 |
| 4,646,170 | 2/1987 | Kobayashi et al. | 371/40.1 |
| 4,646,301 | 2/1987 | Okamoto et al. | 371/37.4 |
| 4,683,572 | 7/1987 | Baggen et al. | 371/37.5 |
| 4,716,567 | 12/1987 | Ito et al. | 371/37.2 |

*Primary Examiner*—Charles E. Atkinson

[57] ABSTRACT

Errors which arise in recording and reproducing data in a recording material are corrected with the use of an error correction code such as an RS (Reed-Solomon) code, and a two stage $C_2$ and $C_1$ coding method is conducted at an interval of repetition of a combination of $[k_2/n_2]$ and $[k_2/n_2]+1$ on digital data having a two dimensional arrangement of $k_1$ in the first direction and $k_2$ in the second direction, whereby burst error correction ability is enhanced by the enhancement of error correction capacity.

27 Claims, 4 Drawing Sheets

TWO STAGE CODING METHOD

Matter enclosed in heavy brackets [ ] appears in the original patent but forms no part of this reissue specification; matter printed in italics indicates the additions made by reissue.

TECHNICAL FIELD

The present invention relates to a two stage coding method having a high burst error correction ability and also a random error correction ability equivalent to that of the prior art when an error correction code such as a Reed Solomon code (hereinafter referred to as "RS code") is used in order to correct data errors which arise in reproducing data recorded in a recording material such as a magnetic disk.

BACKGROUND ART

Generally, in recording and reproducing data into and from a recording material such as a magnetic disk a data error may arise dependent on the state of the recording material. A data error may be a burst error caused by a signal drop out [on] *or* a random error caused by a deterioration in SN ratio. In order to correct these errors a two stage coded error correction code is used. As an example, a two stage code using RS codes on a GF [$(2^8)$] $(2^q)$ where $q=8$ will be considered. A two stage encoder is shown in FIG. 3. In FIG. 3, reference numeral 1 designates an input terminal, reference numeral 2 designates a $C_2$ encoder, reference numeral 3 designates an interleaving circuit, reference numeral 4 designates a $C_1$ encoder, the reference numeral 5 designates an output terminal. First of all, $C_2$ encoding is performed on the original data, interleaving is executed thereto, and thereafter $C_1$ encoding is conducted, and the resulting code signal is output to the output terminal. A two stage decoder is shown in FIG. 4. In FIG. 4, reference numeral 6 designates an input terminal, reference numeral 7 designates a $C_1$ decoder, reference numeral 8 designates a deinterleaving circuit, reference numeral 9 designates a $C_2$ decoder, and reference numeral 10 designates an output terminal. In this decoder deinterleaving is executed after the $C_1$ decoding, and thereafter $C_2$ decoding is conducted. There is a prior art two stage coding method which, assuming that data obtained by arranging [$k_1 \times 9$] $k_1 \times q$ digits in a first direction and $k_2$ digits ($k_1 < k_2$) in a second direction as shown in FIG. 5 is arranged into 8 [data] *digit* words in the first direction, consists of adding a first check code of $n_2 - k_1$ digits, and thereafter adding a second check code of $n_1 - n_2$ digits as shown in FIG. 2, $(n_2, k_1)$ RS code is used as the $C_2$ code, and $(n_1, n_2)$ RS code is used as the $C_1$ code.

A specific coding example will be described with reference to FIGS. 5 and 2. When it is established that $k_1=32$, $k_2=128$, $n_1=40$, $n_2=36$, and $h_1=h_2= \ldots =h_{35}=h=3$, the data region comprising the data and the first check code becomes data of $n_2 \times k_2=4608$ digits as shown in FIG. 5, and when $a_1$ is set to 1, $a_2$ to $a_{36}$ become as follows:

$$a_2 = a_1 + n_2 \times h + 1 = 110$$
$$a_3 = a_2 + n_2 \times h + 1 = 219$$
$$\vdots$$
$$a_{32} = a_{31} + n_2 \times h + 1 = 3380$$

-continued $$\vdots$$
$$a_{36} = a_{35} + n_2 \times h + 1 = 3816$$

and $C_2$ encoding is conducted on the data corresponding to the $a_1$-th, $a_2$-th, . . . , $a_{32}$-th data *selected* with use of the following generation polynomial of $C_2$ code $$G_2(x) = \prod_{i=0}^{n_2-K_1-1} (x - \alpha^i).$$

where $\alpha$ is a root of a primary polynomial (for example, such as $x^8+x^4+x^3+x^2+1$ on GF $(2^8)$). The generated check codes are arranged at the positions corresponding to the $a_{33}$-th, $a_{34}$-th, . . . , $a_{36}$-th data. Next, $a_1$ is set as follows:

$$a_1 = a_1 + n_2 = a_1 + 36,$$

and similarly check codes are added to the data successively. Herein, if the calculated result of $a_2$ to $a_{36}$ exceeds $n_2 \times k_2=4608$, a number obtained by subtracting 4608 therefrom is made the result. The encoding is repeated $k_2$ times thereby to conclude the $C_2$ encoding.

Next, $C_1$ encoding is conducted on the data of $n_2$ digits in each column arranged in the first direction as shown in FIG. 2 with the use of the following generation polynomial of $C_1$ code $$G_1(x) = \prod_{i=0}^{n_1-n_2-1} (x - \alpha^i).$$

The generated check code is added to the end portion of the data and the encoding is repeated $k_2$ times. In the recording of the data onto the recording material data of $n_1=40$ digits arranged in the first direction is sent out $k_2$ times successively. In the reproduction of the same the sent out data are arranged in a column in the first direction by 40 digits successively.

In the prior art two stage coding method with such a construction, the $C_2$ code is concerned with burst error correction ability, and the $C_1$ and $C_2$ codes are concerned with random error correction ability. In the stage of conducting $C_2$ encoding the h must be made large in order to enhance the burst error correction ability, and h is set as follows:

$$h=[k_2/n_2]=[128/36]=3$$

*where [A] denotes an integer which does not exceed A* The $C_2$ codes are gathered at the right end portion of the data region in FIG. 5, and the $C_2$ and the $C_1$ code are arranged adjacent to each other in the first direction subsequent to the data of $k_1=32$ digits when the $C_1$ encoding is completed.

The prior art two stage coding method is constructed in such a manner, and the error correction ability by one code amounts to $n_2-k_1$ digits when forfeiture correction is conducted by the $C_2$ decoding. Accordingly, the burst error correction ability becomes as follows for data of $n_2 \times k_2=4608$ digits comprising all the data and the $C_2$ code $$(n_2-k_1) \times n_2 \times h=432,$$

but h becomes as follows:

$$h=[k_2/n_2]=[128/36]=3<128/36,$$

and $k_2/n_2$ does not equal an integer, thereby resulting in deterioration of error correction capability.

DISCLOSURE OF THE INVENTION

The present invention is directed to solve the problems pointed out above and an object is to provide a two stage coding method in which the above-described deterioration in a burst error correction ability is improved and a higher burst error correction ability than that of the prior art device is obtained.

According to the coding method of the present invention, assuming that data of $k_1 \times 8 \times k_2$ digits are arranged in a matrix of $k_1 \times 8$ digits in a first direction and $k_2$ digits(s) in a second direction and the data is divided into words of 8 digit(s) in the first direction, in conducting $C_2$ encoding by taking out $n_2$ data words from the data of [$n_2$] $n_2-k_1$ words in the first direction and $k_2$ words in the second direction with no duplication of data in either of the first and second directions, a $C_2$ code of [code] length [$n_2$] $n_2-k_1$ is produced by establishing $a_1$ at an arbitrary data number word, and establishing $h_1, h_2, \ldots, h_{n2-1}$ such that they become a repetition of a combination satisfying the condition that $[k_2/n_2]$ and $[k_2/n_2]+1$ may be $$[k_2/n_2]\times l_1+([k_2/n_2]+1)\times l_2 \leqq k_2$$

(herein, $l_1+l_2=n_2$($l_1$, $l_2$: integer) and $a_2$ to $a_{n2}$ exceeding $n_2 \times k_2$ are obtained by subtracting $n_2 \times k_2$ therefrom) for $a_2$ to $a_{n2}$ as in the following:

$$\begin{aligned} a_2 &= a_1 + n_2 \times h1 + 1 \\ a_3 &= a_2 + n_2 \times h_2 + 1 \\ &\vdots \\ a_{k1} &= a_{k-1} + n_2 \times h_{k1-1} + 1 \\ &\vdots \\ a_{n2} &= a_{n-1} + n_2 \times h_{n2-1} + 1 \end{aligned}$$

when numbering is conducted successively in the first direction on the data of $n_2$ words in the first direction and $k_2$ words in the second direction, and this is repeated $k_2$ words in the second direction, and thereafter $C_1$ encoding of each $n_2 \times q$ digits in the first direction [into a], *forming an $C_1C_2$ encoded data matrix having a total* code length $n_1$ is conducted.

In the two stage coding method of the present invention, $C_2$ codes are constructed to be effective for error correction at the portion of $n_2-k_1$ in the first direction and at the portion of $k_2$ in the second direction against the data obtained by arranging $k_1$ digits in the first direction and $k_2$ digits in the second direction, as shown in FIG. 1. According to the present invention, the burst error correction ability against the data of $n_2 \times k_2=4608$ digits comprising all the data, and the $C_2$ codes becomes $$(n_2-k_1)\times n_2\times(h_A+h_B)/2=504.$$

and this exceeds 432 which is the burst error correction ability of the prior art device against the same number of data and the same number of check codes.

In this way, it is possible to conduct a two stage coding having a higher burst error correction ability than that of the prior art, and having a random error correction ability equivalent to that of the prior art due to the $C_1$ and $C_2$ codes.

BEST MODES OF EMBODYING THE INVENTION

Figure 1:
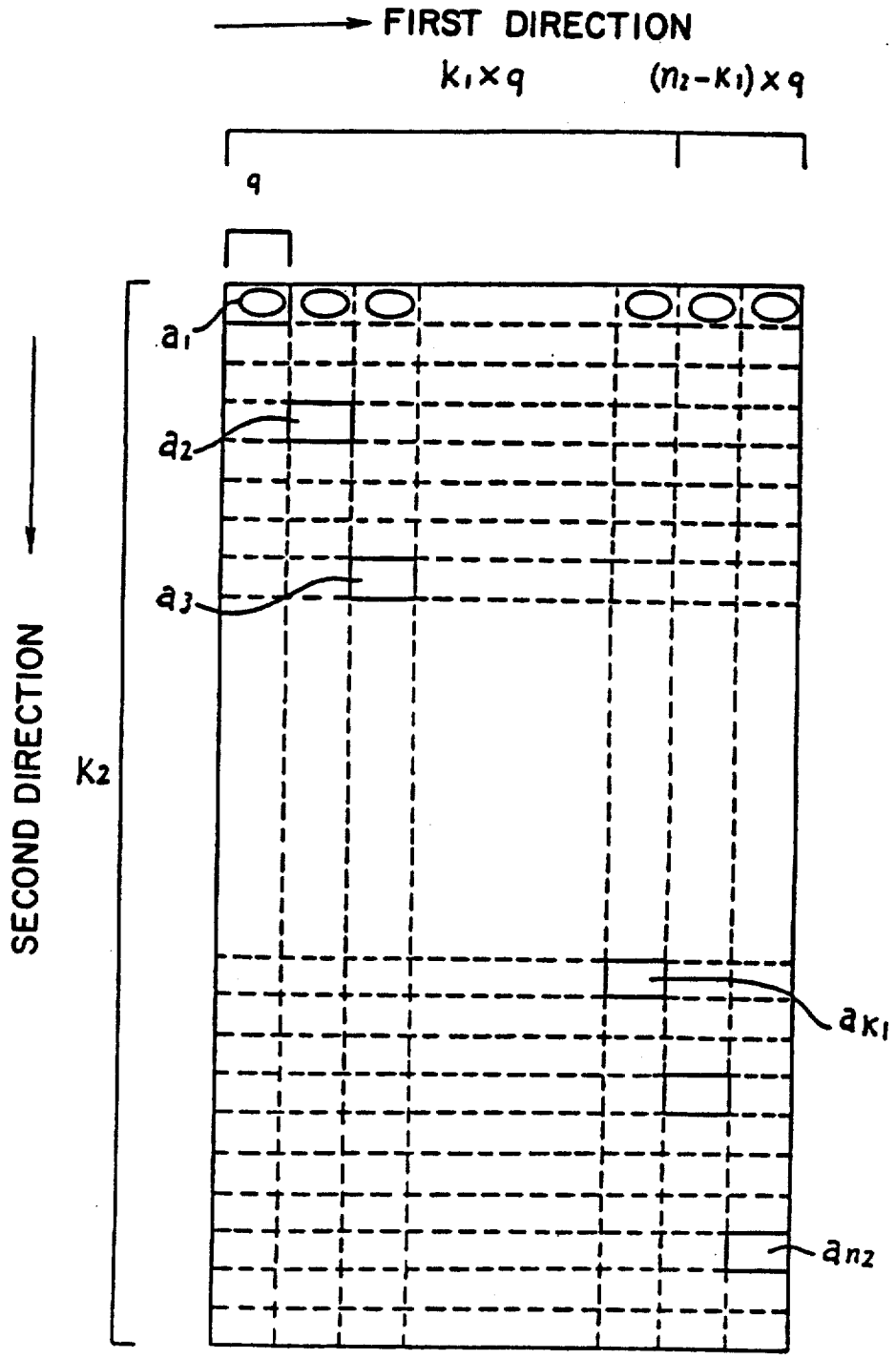
FIG. 1 is a diagram showing a data arrangement for conducting a $C_2$ encoding method as one embodiment of the present invention.
Figure 2:
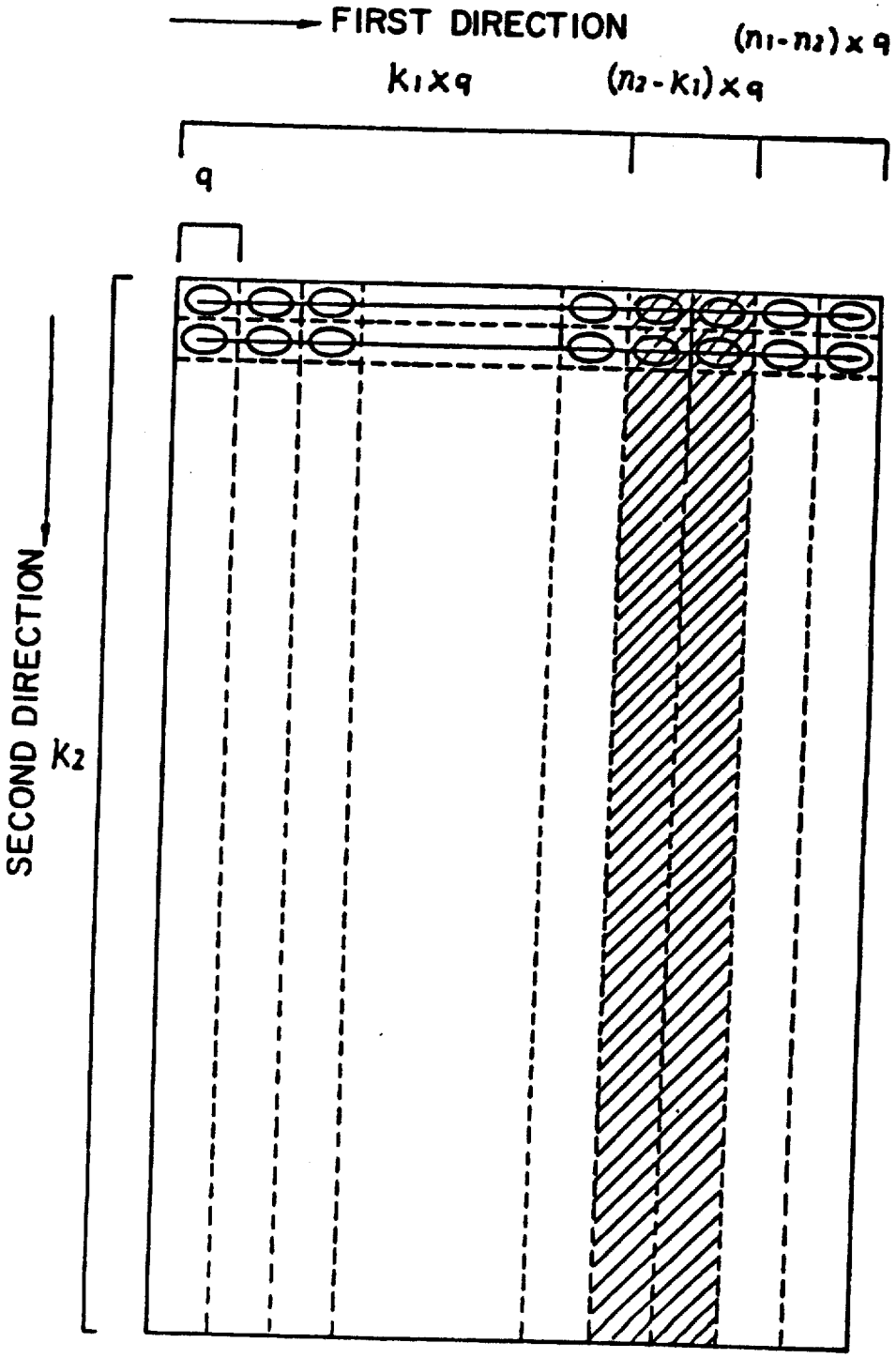
FIG. 2 is a diagram showing a data arrangement for conducting a prior art two stage coding method and a $C_1$ encoding method as an embodiment of the present invention.
Figure 3:
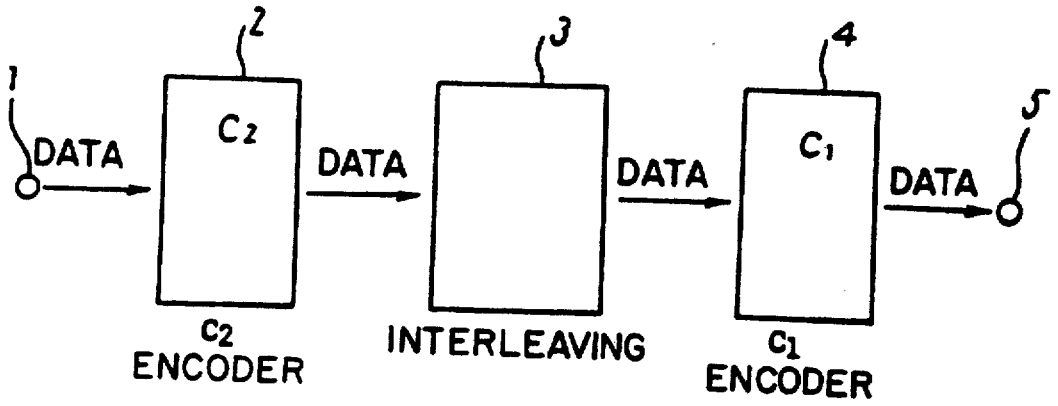
FIG. 3 is a block diagram showing a two stage encoding circuit.
Figure 4:
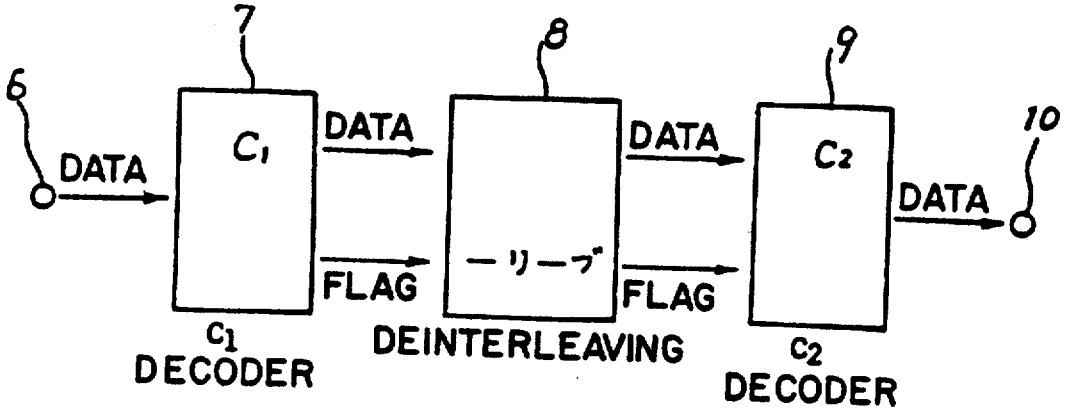
FIG. 4 is a block diagram showing a two stage decoding circuit.

Embodiments of the present invention will be described with reference to the drawings. In FIGS. 1 and 2, the constants are established that $q=8$, $k_1=32$, $k_2=128$, $n_1=40$, $n_2=36$, and data are divided into words of 8 digits in the first direction. FIG. 1 shows a $C_2$ encoding method. Data of $k_1 \times k_2=4096$ data words are arranged sequentially in the first direction and in a matrix of $k_1=32$ words in the first direction and $k_2=128$ words in the second direction, and when $h_{2i-1}$ and $h_{2i}$ are set as follows $$h_{2i-1}=h_A=]k_2/n_2]=3$$

$$h_{2i}=h_B=[k_2/n_2]+1=4,$$

(i: integer, $1 \leqq i \leqq (n_2-1)/2$)
and $a_1$ is set 1, $a_2$ to $a_{36}$ become $$\begin{aligned} a_2 &= a_1 + n_2 \times h_A + 1 = 110 \\ a_3 &= a_2 + n_2 \times h_B + 1 = 255 \\ &\vdots \\ a_{32} &= a_{31} + n_2 \times h_A + 1 = 3920 \\ a_{36} &= a_{35} + n_2 \times h_A + 1 = 4428 \end{aligned}$$

and, $C_2$ encoding is performed on the data corresponding to the $a_1$-th, $a_2$-th, . . . , and $a_{32}$-th data with the use of the generation polynomial of the $C_2$ code $$G_2(x) = \prod_{i=0}^{n_2-k_1-1} (x - \alpha^i).$$

Herein, $\alpha$ is a root of a primary polynomial. The generated check codes are arranged at the positions corresponding to the $a_{33}$-th, $a_{34}$-th, . . . , $a_{36}$-th data. Next, $a_1$ is set as follows $$a_1=a_1+n_2=a_1+36$$

and similarly inspection codes are added to the data successively. $a_2$ to $a_{36}$ exceeding $n_2 \times k_2=4608$ are made by subtracting 4608 therefrom. When this encoding operation is repeated $k_2$ times the $C_2$ encoding is completed.

Next, $C_1$ encoding is performed on the data of $n_2$ words in each column arranged in the first direction as shown in FIG. 2 with the use of the generation polynomial of $C_1$ code $$G_1(x) = \prod_{i=0}^{n_1-n_2-1} (x - \alpha^i).$$

The generated check codes are added to the data, and the encoding is repeated $k_2$ times. The recording of the data on a recording material is conducted by sending out data of $n_1=40$ words arranged in the first direction successively $k_2$ times. The data format reproduction is conducted by arranging the sent out data by 40 words successively in a column in the first direction.

In the two stage coding method of the present invention, the $C_2$ code is concerned with burst error correction ability and both $C_1$ and $C_2$ codes are concerned with random error correction ability. In conducting the $C_2$ encoding, $C_2$ codes of $n_2-k_1$ in the first direction and $k_2$ in the second direction can be used effectively for the error correction of the data arranged in a matrix of $k_1$ in the first direction and $k_2$ in the second direction.

In the above-illustrated embodiment a repetition pattern of $(h_A, h_B)$ is adopted for $h_1, h_2, \ldots, h_{n2-1}$, but other combinations using $h_A$ and $h_B$ such as $(h_B, h_A)$ or $(h_A, h_B, h_B)$ can be used if they comply with the following conditions $$h_A \times l_1 + h_B \times l_2 \leqq k_2$$

$$l_1 + l_2 = n_2$$

Furthermore, an RS code on GF ($2^q$) is used as an error correction code, but another code such as a BCH code can be used as an error correction code. Furthermore, the number of data, the construction of information lengths in the first and second directions, and the $C_2$ and $C_1$ code lengths can be arbitrarily established. Furthermore, in the illustrated embodiment the region occupied by the check codes of the $C_2$ code and the $C_1$ code is shown in FIG. 2, but this occupied region can be arbitrarily established by establishing $a_1$ at an arbitrary number.

Furthermore, it is possible to add the additional information of $k_3 \times q$ digits in the second direction $k_2$ times precedent to the $C_1$ encoding, and thereafter to conduct $C_1$ encoding on GF ($2^q$) having the $(n_1+k_3) \times q$ digits in the first direction, and to conduct a coding $k_2$ times repeatedly in the second direction.

APPLICABILITY TO THE INDUSTRY

The present invention is applicable not only to a magnetic disk apparatus but also to an optical recording and reproducing apparatus, and an optical magnetic recording and reproducing apparatus.

We claim:

1. A two stage coding system for encoding digital information arranged in a matrix of $k_1 \times q$ digits in a first direction, and $k_2$ digits in a second direction orthogonal to the first direction, wherein $K_1$, q, and $k_2$ are integers, $K_1 < k_2$; q = the number of digits per data word, and $K_1$, $K_2$ = the number of data words in said first and second directions respectively, comprising:

$C_2$ encoder means for encoding said digital information with a $C_2$ code on a Galois Field GF ($2^q$), including means for [numbering] *selecting* data words in said matrix diagonally from an arbitrary data word $a_1$ and establishing $a_2$ to $a_{n2}$, wherein $n_2$ is the length of [code] *the $C_2$ encoded data*, such that $$a_2 = a_1 + n_2 \times h_1 + 1$$
$$a_3 = a_2 + n_2 \times h_2 + 1$$
$$\vdots$$
$$a_{k1} = a_{k1-1} + n_2 \times h_{k1-1} + 1$$
$$\vdots$$
$$a_{n2} = a_{n2-1} + n_2 \times h_{n2-1} + 1$$

wherein $h_1$ to $h_{n2-1}$ satisfy the following $$h_{2i-1} = [K_2/n_2]$$

$$h_{2i} = [k_2/n_2] + 1 \quad 1 \leqq i \leqq (n_2-1)/2$$

*said $C_2$ encode means including* means for $C_2$ encoding said [numbered] *selected* data words, and means for adding the obtained $C_2$ code to an end of said matrix in said first direction; and $C_1$ encoder means for encoding said $C_2$ encoded matrix with a $C_1$ code having a *predetermined* length [of $n_1$] on a GF ($2^q$) for each row of data words in said first direction, and adding the obtained $C_1$ code to an end of said matrix in said first direction.

*2. The two stage coding system of claim 1 wherein said means for $C_2$ encoding further encodes said selected data words in each said diagonal;*

*said means for adding a $C_2$ code to the end of each said diagonal to form a $C_2$ code field at the end of said matrix in said first direction.*

*3. The two stage coding system of claim 2 wherein said $C_2$ encoder means subtracts $n_2 \times k_2$ from any initially calculated value of $a_2$ to $a_{n2}$ that exceed $n_2 \times k_2$ to select data words in said matrix diagonally.*

*4. The two stage coding system of claim 1 wherein said $C_2$ encoder means subtracts $n_2 \times k_2$ from any initially calculated value of $a_2$ to $a_{n2}$ that exceed $n_2 \times k_2$ to select data words in said matrix diagonally.*

*5. The two stage coding system of claim 1 wherein additional data added to said rows of data words in said first direction prior to encoding of said $C_2$ encoded matrix with a $C_1$ code is also encoded with this $C_1$ code by said $C_1$ encoder means.*

*6. A two stage coding system for encoding digital information arranged in an information matrix of $k_1 \times q$ digits in a first direction, and $k_2$ digits in a second direction orthogonal to the first direction, wherein*

*$k_1$, q, and $k_2$ are integers,*

*$k_1 < k_2$; q = the number of digits per data word, and*

*$k_1$, $k_2$ = the number of data words in said first and second directions respectively, comprising:*

*$C_2$ encoder means for encoding said digital information with a $C_2$ code on a Galois field GF($2^2$), said $C_2$ encoder means selecting data words in said information matrix diagonally from an arbitrary data word $a_1$ and including $a_2$ to $a_{n2}$, wherein $n_2$ is the length of the $C_2$ encoded data, such that*

$$a_2 = a_1 + n_2 \times h_1 + 1$$

$$a_3 = a_2 + n_2 \times h_2 + 1$$

:

$a_{k1}=a_{k1-1}+n_2\times h_{k1-1}+1$

:

$a_{n2}=a_{n2-1}+n_2\times h_{n2-1}+1,$ $h_1$ to $h_{2n-1}$ each being selected from one of $h_A$ and $h_B$, wherein, $h_A=[k_2/n_2],$ $h_B=[k_2/n_2]+1,$ and $h_A\times l_1+h_B\times l_2\leqq k_2,$ where $l_1+l_2=n_2$ said $C_2$ encoder means forming said $C_2$ code from said selected data words and adding the obtained $C_2$ code to an end of said information matrix in said first direction thereby forming a $C_2$ encoded matrix; and $C_1$ encoder means for encoding each line in said first direction of said $C_2$ encoded matrix with a $C_1$ code having a predetermined length on a $GF(2^q)$, and adding the obtained $C_1$ code to an end of each said line of said matrix in said first direction to form a $C_2C_1$ encoded matrix.

7. The two stage coding system of claim 6 wherein a group of two or more adjacent lines $h_1$, $h_2$, . . . utilize a repetition pattern having at least one of each of $h_A$ and $h_B$ contained therein, said selection of data words $a_1$ to $a_n$ by said $C_2$ encoder means utilizing said repetition pattern for selection of all said data words (a) in said information matrix.

8. The two stage coding system of claim 7 wherein said repetition pattern is selected from the group consisting of $h_A$, $h_B$; $h_B$, $h_A$; and $h_A$, $h_B$, $h_B$.

9. The two stage coding system of claim 6 wherein:

$h_{2i-1}=h_A,$ $h_{2i}=h_B,$ where $1<i<(n_2-1)/2$.

10. The two stage coding system of claim 6 wherein:

$h_{2i-1}=h_B,$ $h_{2i}=h_A,$ where $1<i<(n_2-1)/2$.

11. The two stage coding system of claim 6 wherein said $C_2$ encoder means repeatedly selects data words in said information matrix from an arbitrary data word $a_1$ and including $a_2$ to $a_{n2}$, said $C_2$ encoder means repeatedly forming said $C_2$ code and adding said $C_2$ to the end of the matrix, each repetition starting from a different arbitrary data word $a_1$.

12. The two stage coding system of claim 11 wherein said $C_2$ encoder means selects $k_2$ arbitrary data words from which to perform selecting, forming and adding to thereby form a complete $C_2$ encoded matrix.

13. The two stage coding system of claim 6 wherein said means for $C_2$ encoding further encodes said selected data words in each said diagonal;

said means for adding a $C_2$ code to the end of each said diagonal to form a $C_2$ code field at the end of said information matrix in said first direction.

14. The two stage coding system of claim 6 wherein additional data added to said rows of data words in said first direction prior to encoding of said $C_2$ encoded matrix with a $C_1$ code is also encoded with this $C_1$ code by said $C_1$ encoder means to thereby form said $C_2C_1$ encoded matrix.

15. The two stage coding system of claim 14 wherein the length of said $C_2C_1$ encoded data matrix in the first direction is $(n_1+k_3)\times q$ digits, where $k_3$ is an integer.

16. The two stage coding system of claim 6 wherein said $C_2$ encoder means subtracts $n_2\times k_2$ from any initially calculated value of $a_2$ to $a_{n2}$ that exceed $n_2\times k_2$ to select data words in said matrix diagonally.

17. The two stage coding system of claim 6 wherein the length of said $C_2C_1$ encoded data matrix in the first direction is $n_1\times q$ digits.

18. A two stage coding system for encoding digital information arranged in an information matrix of $k_1\times q$ digits in a first direction, and $k_2$ digits in a second direction orthogonal to the first direction, wherein $k_1$, $q$, and $k_2$ are integers, $k_1<k_2$; $q$=the number of digits per data word, and $k_1$, $k_2$=the number of data words in said first and second directions respectively, said system further single stage coding additional information of $k_3\times q$ digits in the first direction, where $k_3$ is an integer and $k_2$ digits in the second direction, comprising:

$C_2$ encoder means for encoding said digital information with a $C_2$ code on a Galois field $GF(2^q)$, said $C_2$ encoder means selecting data words in said information matrix diagonally from an arbitrary data word $a_1$ and including $a_2$ to $a_{n2}$, wherein $n_2$ is the length of the $C_2$ encoded data, such that $a_2=a_1+n_2\times h_1+1$ $a_3=a_2+n_2\times h_2+1$

:

$a_{k1}=a_{k1-1}+n_2\times h_{k1-1}+1$

:

$a_{n2}=a_{n2-1}+n_2\times h_{n2-1}+1$ $h_1$ to $h_{n2-1}$ each being selected from one of $h_A$ and $h_B$, wherein, $h_A=[k_2/n_2],$ $h_B=[k_2/n_2]+1,$ and $h_A\times l_1+h_B\times l_2\leqq k_2,$ where $l_1+l_2=n_2$ said $C_2$ encoder means forming said $C_2$ code from said selected data words and adding the obtained $C_2$ code to an end of said information matrix in said first direction to form a $C_2$ encoded matrix; and said additional data of $k_3$ words and said $C_2$ encoded matrix collectively forming an added data matrix having $k_2$ lines;

$C_1$ encoder means for encoding each of said $k_2$ lines extending in said first direction of said added data matrix with a $C_1$ code having a predetermined length on a $GF(2^q)$, and adding the obtained $C_1$ code to an

*end of each said line of said added data matrix in said first direction to form a $C_2C_1$ encoded matrix.*

*19. The two stage coding system of claim 18 wherein a group of two or more adjacent lines $h_1$, $h_2$, . . . utilize a repetition pattern having at least one of each of $h_A$ and $h_B$ contained therein, said selection of data words $a_1$ to $a_n$ by said $C_2$ encoder means utilizing said repetition pattern for selection of all said data words (a) in said information matrix.*

*20. The two stage coding system of claim 19 wherein said repetition pattern is selected from the group consisting of $h_A$, $h_B$; $h_B$, $h_A$; and $h_A$, $h_B$, $h_B$.*

*21. The two stage coding system of claim 18 wherein:*

$$h_{2i-1}=h_A,$$

$$h_{2i}=h_B,$$

*where $1<i<(n_2-1)/2$.*

*22. The two stage coding system of claim 18 wherein:*

$$h_{2i-1}=h_B,$$

$$h_{2i}=h_A,$$

*where $1<i<(n_2-1)/2$.*

*23. The two stage coding system of claim 18 wherein said $C_2$ encoder means repeatedly selects data words in said information matrix from an arbitrary data word $a_1$ and including $a_2$ to $a_{n2}$, said $C_2$ encoder means repeatedly forming said $C_2$ code and adding said $C_2$ to the end of the matrix, each repetition starting from a different arbitrary data word $a_1$.*

*24. The two stage coding system of claim 23 wherein said $C_2$ encoder means selects $k_2$ arbitrary data words from which to perform selecting, forming and adding to thereby form a complete $C_2$ encoded matrix.*

*25. The two stage coding system of claim 18 wherein said means for $C_2$ encoding further encodes said selected data words in each said diagonal;*

*said means for adding a $C_2$ code to the end of each said diagonal to form a $C_2$ code field at the end of said information matrix in said first direction.*

*26. The two stage coding system of claim 18 wherein said $C_2$ encoder means subtracts $n_2 \times k_2$ from any initially calculated value of $a_2$ to $a_{n2}$ that exceed $n_2 \times k_2$ to select data words in said information matrix diagonally.*

*27. The two stage coding system of claim 18 wherein the length of said $C_2C_1$ encoded matrix in the first direction is $(n_1+k_3)\times q$ digits.*

* * * * *

UNITED STATES PATENT AND TRADEMARK OFFICE

CERTIFICATE OF CORRECTION

PATENT NO. : Re. 34,245
DATED : May 11, 1993
INVENTOR(S) : Kiyoshi Matsutani, et. al.

Figure 5:
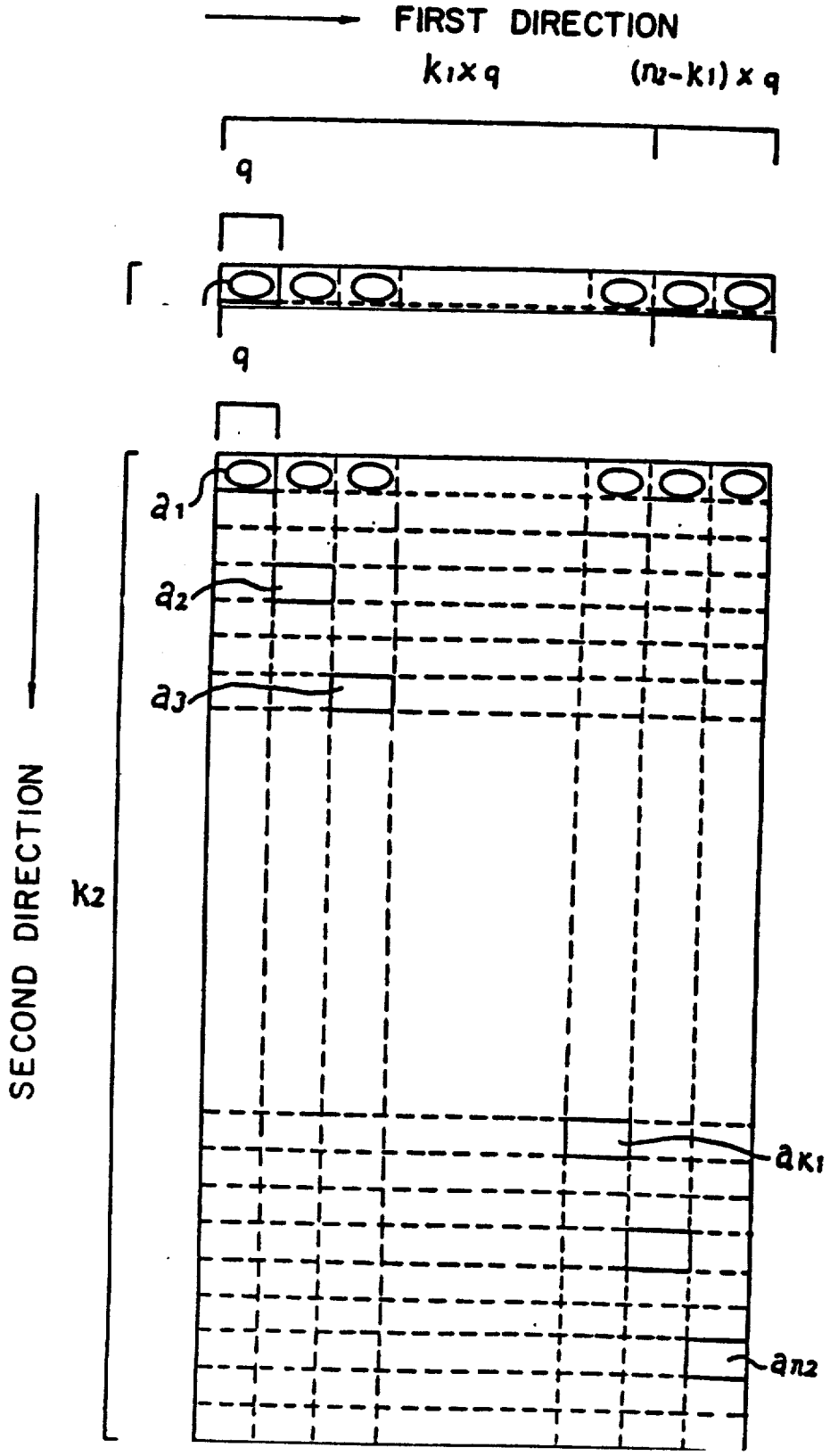
FIG. 5 is a diagram showing a data arrangement for conducting the $C_2$ encoding method of the prior art two stage coding method.

It is certified that error appears in the above-indentified patent and that said Letters Patent is hereby corrected as shown below:

Fig. 5 should be deleted to be replaced with Fig. 5 as shown on attached sheet.

Signed and Sealed this

Twenty-fourth Day of May, 1994

*Attest:*

Bruce Lehman

BRUCE LEHMAN

*Attesting Officer*

*Commissioner of Patents and Trademarks*

UNITED STATES PATENT AND TRADEMARK OFFICE

CERTIFICATE OF CORRECTION

PATENT NO. : Re. 34,245

DATED : May 11, 1993

INVENTOR(S) : Kiyoshi Matsutani, et. al.

It is certified that error appears in the above-indentified patent and that said Letters Patent is hereby corrected as shown below:

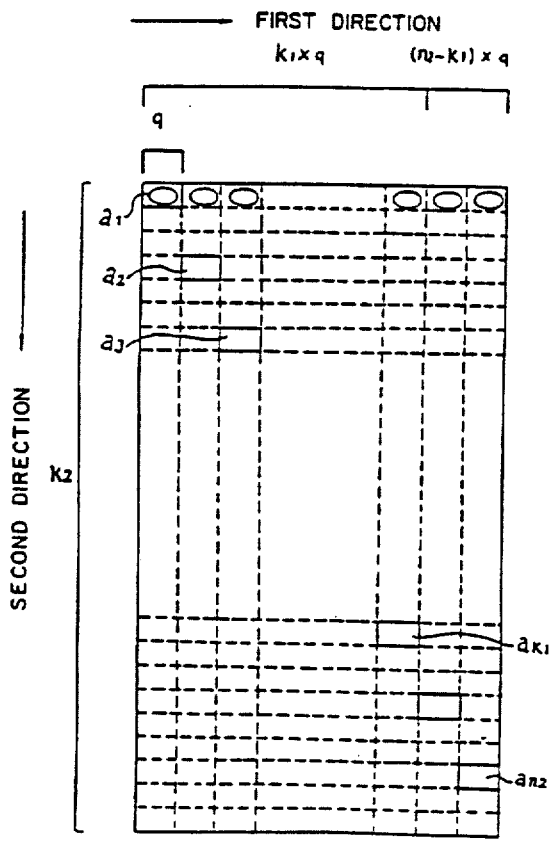

FIG. 5